(12) United States Patent
Gobara et al.

(10) Patent No.: US 7,302,125 B2
(45) Date of Patent: Nov. 27, 2007

(54) OPTICAL DEVICE AND OPTICAL APPARATUS

(75) Inventors: Taku Gobara, Kyoto (JP); Masanori Minamio, Osaka (JP); Katsutoshi Shimizu, Kyoto (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 11/260,175

(22) Filed: Oct. 28, 2005

(65) Prior Publication Data

US 2006/0110097 A1 May 25, 2006

(30) Foreign Application Priority Data

Nov. 22, 2004 (JP) ............................. 2004-337317

(51) Int. Cl.
  *G02B 6/12* (2006.01)
  *H04B 10/04* (2006.01)
  *H04B 10/12* (2006.01)
(52) U.S. Cl. .................. 385/14; 398/182; 398/202; 385/92; 385/93
(58) Field of Classification Search .................. 385/14, 385/88–94, 147; 398/182, 200, 201, 202, 398/212, 214
See application file for complete search history.

(56) References Cited

U.S. PATENT DOCUMENTS 6,512,861 B2 * 1/2003 Chakravorty et al. .......... 385/14

FOREIGN PATENT DOCUMENTS

| JP | 11-164209 | 6/1999 |
|---|---|---|
| JP | 2001-298050 | 10/2001 |
| JP | 2002-299592 | 10/2002 |
| JP | 2004-165414 | 6/2004 |
| JP | 2004-304054 | 10/2004 |

OTHER PUBLICATIONS

US Office Action issued in corresponding U.S. Appl. No. 11/260,175, dated Mar. 30, 2007.
Japanese Office Action, with English Translation, issued in corresponding Japanese Patent Application No. 2004-337317, dated on Jun. 8, 2007.

* cited by examiner

*Primary Examiner*—Kevin S. Wood
(74) *Attorney, Agent, or Firm*—McDermott Will & Emery LLP

(57) ABSTRACT

An optical device according to the present invention includes a device substrate, a translucent member, an optical element chip and a conductive portion. On a surface of the device substrate, an opening is provided so as to extend substantially in the vertical direction with respect to a surface of the device substrate and pass through the device substrate, the translucent member is provided so as to cover a first opening mouth of the opening, and the optical element chip is provided so as to cover a second opening mouth thereof. Part of the conductive portion is exposed at the device substrate to form a terminal portion. The terminal portion is provided so as to be substantially flush with the surface of the device and serves as a mount portion to be directly mounted on the interconnect substrate.

15 Claims, 7 Drawing Sheets

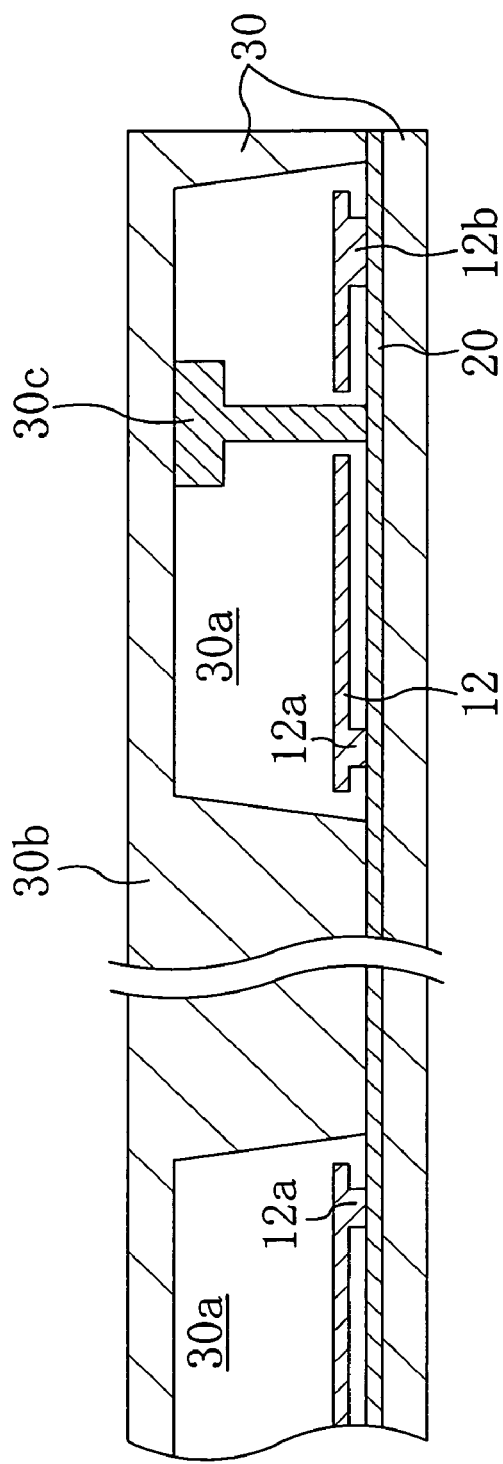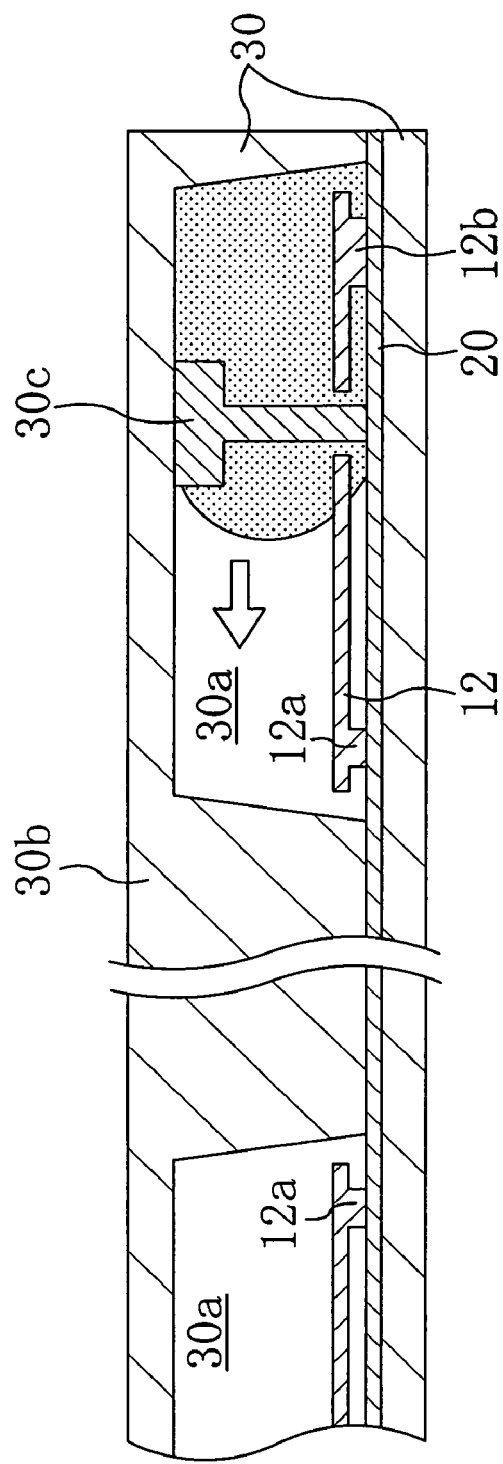

OPTICAL DEVICE AND OPTICAL APPARATUS

CROSS-REFERENCE TO RELATED APPLICATION

This application claims priority under 35 U.S.C. §119(a) on Japanese Patent Application No. 2004-337317 filed on Nov. 22, 2004, the entire contents of which are hereby incorporated by reference.

BACKGROUND OF THE INVENTION

1. Field of the Invention

The present invention relates to optical devices and optical apparatuses and more particularly relates to an optical device including an optical element chip in which an optical element for emitting or receiving light and an optical apparatus including the optical device.

2. Description of the Prior Art

Conventionally, optical apparatuses in which an optical element for emitting or receiving light is mounted have been known.

For example, in Japanese Laid-Open Publication No. 10-135397, as shown in FIG. 8, disclosed is a semiconductor device (optical apparatus) including a printed wiring board (wiring board) 501 including a concave portion 507 in a surface thereof, an interconnect metal 502 formed on part of the surface of the printed wiring board 501 excluding part of the substrate in which the concave portion 507 is formed, a resin portion 503 of a chip-on-board semiconductor device placed on a surface of the concave portion 507 of the printed wiring board 501 and including a plastic-sealed semiconductor element (optical element) mounting portion, an external lead 504, a connection portion 505 which is part of the external lead 504, is formed so as to be parallel to the surfaces of the printed wiring board 501 and is connected to the interconnect metal 502. In Japanese Laid-Open Publication No. 10-135397, it is described that in the semiconductor device, the resin portion 503 of the chip-on-board semiconductor device is accommodated in the concave portion 507 in the printed wiring board 501 and thus reduction in thickness of the semiconductor device can be achieved.

However, in the semiconductor device described in Japanese Laid-Open Publication No. 10-135397, the resin portion 503 of the chip-on-board semiconductor device is merely placed on the surface of the concave portion 507 of the printed wiring board 501. That is, a surface of the resin portion 503 of the chip-on-board semiconductor device is exposed. Thus, unnecessary light might enter into the semiconductor device from the outside of the semiconductor device. Herein, unnecessary light means light that the semiconductor device should not receive or light that the semiconductor device should not emit.

When the semiconductor element is an element for receiving light, such as a light receiving element, the resin portion 503 of the chip-on-board semiconductor device receives light. In the semiconductor device including the light receiving element, image analysis and the like are performed using light received by the semiconductor element in many cases. Therefore, if received light includes unnecessary light, the semiconductor device can not properly perform analysis such as image analysis or like problems arise.

When the semiconductor device is an element for emitting light, such as a light emitting element, unnecessary light is reflected at a surface of the semiconductor device and mixed with light emitted by the semiconductor element, so that the light is emitted to the outside of the semiconductor device. In the semiconductor device including the light emitting element, light emitted from the semiconductor element is used as a light source for data writing in many cases. Thus, if light emitted from the semiconductor element includes unnecessary light, desired light can not be obtained. Accordingly, data can not be correctly written in a storage medium and like problems arise.

As described above, when the semiconductor device is used for image analysis, desired light can not be received, and when the semiconductor device is used as a light source for data writing, desired light can not be emitted. Therefore, the semiconductor device can not be installed in a video camera, a digital camera, a digital still camera and the like, which require high analysis accuracy.

Moreover, in recent years, reduction in thickness for a video camera, a digital camera, a digital still camera and the like has been required. Accordingly, reduction in thickness for a semiconductor device to be installed in a video camera, a digital camera, a digital still camera and the like is desired.

SUMMARY OF THE INVENTION

It is an object of the present invention to provide an optical device and an optical apparatus which allow prevention of invasion of unnecessary light into the apparatus and reduction in the thickness of the apparatus.

An optical device according to the present invention includes: a device substrate including an opening formed so as to extend substantially in the vertical direction with respect to a surface of the device substrate and pass through the device substrate; a conductive portion including a buried portion buried in the device substrate and a terminal portion extending from the buried portion and exposed at the device substrate; a translucent member provided so as to cover a first opening mouth of the opening; and an optical element chip provided so as to cover a second opening mouth of the opening and including an optical element for emitting or receiving light formed in a surface of the optical element chip facing the translucent member, the optical element being electrically connected to the conductive portion. In the optical device, the terminal portion is a mount portion that is substantially flush with a surface of the device substrate and to be directly mounted on a wiring board.

In the optical device of the present invention, "an opening formed so as to extend substantially in the vertical direction with respect to a surface of the device substrate" means not only an opening extending in the vertical direction in a strict mathematical sense but also an opening extending in the direction slightly shifted from the vertical direction in a strict mathematical sense.

Moreover, "translucent" of the translucent member in the optical device of the present invention means being capable of transmitting light at a transmittance of 70% or more, preferably, 80% or more and, more preferably, 90% or more.

Moreover, as the "optical element" in the optical device of the present invention, a solid state imaging element such as a CCD (charge-coupled device), a set of a plurality of light receiving elements discretely arranged, a light emitting element or the like may be used. When the optical element is a solid state imaging element, the optical device serves as a solid state imaging device. When the optical element is a light receiving element or a light emitting element, the optical device serves as a light receiving device or a light emitting device.

Moreover, in the optical device of the present invention, "the terminal portion is substantially flush with a surface of the device substrate" does not only mean that the terminal portion and the surface of the device substrate are flush with each other in a strict sense. The terminal portion may be provided so as to protrude from the surface of the device substrate by about 10 μm. Also, the terminal portion may be provided so as to be located in part of the device substrate extending inwardly from the surface of the device by about 10 μm.

Moreover, in the optical device of the present invention, "a mount portion is directly mounted on a wiring board" not only literally means that a mount portion is directly mounted on a wiring board in a strict sense but also means that a mount portion is mounted on a wiring board with a conductive adhesive such as solder used for fixing the optical device onto a surface of the wiring board with interposed therebetween. That is, the phrase means that a larger amount of an adhesive than an amount required for fixing the optical device onto the surface of the wiring board is not applied to the mount portion.

Moreover, in the optical device of the present invention, light emitted from the optical element, after passing through the opening in a plate member, transmits through the translucent member and then is output to the outside of the optical device. Light received by the optical device of the present invention, after transmitting through the translucent member and being input into the optical device, passes through the opening in a plate member and then is received by the optical device.

In the optical device of the present invention, it is preferable that the electrical connection portion between the optical element and the conductive portion is encapsulated by an encapsulant.

A first optical apparatus according to the present invention includes: an optical device including a device substrate including an opening formed so as to extend substantially in the vertical direction with respect to a surface of the device substrate and pass through the device substrate, a conductive portion including a buried portion buried in the device substrate and a terminal portion extending from the buried portion and exposed at the device substrate, a translucent member provided so as to cover a first opening mouth of the opening, and an optical element chip provided so as to cover a second opening mouth of the opening and including an optical element for emitting or receiving light formed in a surface of the optical element chip facing the translucent member, the optical element being electrically connected to the conductive portion; and a wiring board on which the optical device is mounted. In the optical apparatus, the optical element chip is accommodated in an accommodating portion provided in the wiring board.

A second optical apparatus according to the present invention includes an optical device including a device substrate including an opening formed so as to extend substantially in the vertical direction with respect to a surface of the device substrate and pass through the device substrate, a conductive portion including a buried portion buried in the device substrate and a terminal portion extending from the buried portion and exposed at the device substrate, a translucent member provided so as to cover a first opening mouth of the opening, and an optical element chip provided so as to cover a second opening mouth of the opening and including an optical element for emitting or receiving light formed in a surface of the optical element chip facing the translucent member, the optical element being electrically connected to the conductive portion; and a wiring board on which the optical device is mounted and which includes an accommodating portion with at least the optical element chip accommodated therein. In the optical apparatus, a maximum thickness of the optical apparatus is smaller than a sum of a maximum thickness of the optical device and a maximum thickness of part of the wiring board in which the accommodating portion is not provided.

In the second optical apparatus, "the thickness of the optical apparatus" means a distance between a back surface of the wiring board and a surface of the translucent member in a state where the optical device is mounted on the wiring board. Also, "the thickness of the optical device" means a distance between a back surface of the optical element chip and the surface of the translucent member. Moreover, "the thickness of part of the wiring board in which the accommodating portion is not formed" means a distance between the back surface of the wiring board and a surface of the wiring board, i.e., a thickness of the wiring board. Note that the respective thickness of the device substrate, the translucent member, the optical element chip, the wiring board and the like might vary depending on cases. Therefore, a maximum thickness is used herein. That is, because the optical element chip is accommodated in the accommodating portion in the wiring board, the maximum thickness of the optical apparatus of the present invention is a smaller than the sum of the maximum thickness of the optical device and the maximum thickness of the wiring board.

A third optical apparatus according to the present invention includes an optical device including a device substrate including an opening formed so as to extend substantially in the vertical direction with respect to a surface of the device substrate and pass through the device substrate, a conductive portion including a buried portion buried in the device substrate and a terminal portion extending from the buried portion and exposed at the device substrate, a translucent member provided so as to cover a first opening mouth of the opening, and an optical element chip provided so as to cover a second opening mouth of the opening and including an optical element for emitting or receiving light formed in a surface of the optical element chip facing the translucent member, the optical element being electrically connected to the conductive portion; and a wiring board on which the optical device is mounted and which includes an accommodating portion with at least the optical element chip accommodated therein. In the optical apparatus, a light blocking member for blocking invasion of light into the optical element chip is provided in the accommodating portion. The light blocking member may be part of the wiring board or an encapsulant which encapsulates the accommodating portion. Note that light of which invasion into the optical apparatus is blocked by the optical blocking member is light which should not be received or light which the optical apparatus should not emit. Hereinafter, the light will be referred to as "unnecessary light".

In each of the first, second and third optical apparatuses, the meaning of a term "substantially" and the meaning of a phrase "a mount portion is directly mounted on a wiring board" are as described above.

Moreover, the optical element in each of the first, second and third optical apparatus is configured in the manner described above. When the optical element is a solid state imaging device, the optical apparatus is a solid state imaging apparatus. When the optical element is light receiving element or a light emitting element, the optical apparatus is an optical pickup used in a system including a DVD, a CD, a MD or the like.

Moreover, in each of the first, second and third optical apparatus, it is preferable that the accommodating portion is larger than the optical element chip.

Moreover, in each of the first, second and third optical apparatus, it is preferable that the electrical connection portion between the optical element and the conductive portion is encapsulated by an encapsulant. The meaning of an electrical connection portion between an optical element and a conductive portion is as described above.

Moreover, in one preferred embodiment of the present invention in connection with the first, second and third optical apparatuses, the accommodating portion is a concave portion formed in a surface of the wiring board. In this case, the light blocking member in the third optical apparatus is part of the wiring board. Furthermore, if the accommodating portion, i.e., the concave portion is encapsulated by the accommodating portion encapsulant, part of the wiring board and the accommodating portion encapsulant serve as the light blocking member. In such a case, it is preferable that a semiconductor element chip such as a DSP (digital signal processor) is accommodated. In another preferred embodiment of the present invention in connection with the first, second and third optical apparatuses, the accommodating portion is a through hole formed so as to extend substantially in the vertical direction with respect to a surface of the wiring board. In such a case, it is preferable that the through hole is encapsulated by a through hole encapsulant and the through hole encapsulant serves as the light blocking member in the third optical apparatus.

BRIEF DESCRIPTION OF THE DRAWINGS

FIGS. 4A and 4B are cross-sectional views illustrating respective part of steps for fabricating the optical device 1 according to the first embodiment.

DESCRIPTION OF THE PREFERRED EMBODIMENTS

Hereinafter, embodiments of the present invention will be described in detail with reference to the accompanying drawings. Note that the present invention is not limited to the following embodiments.

First Embodiment

Figure 1A:
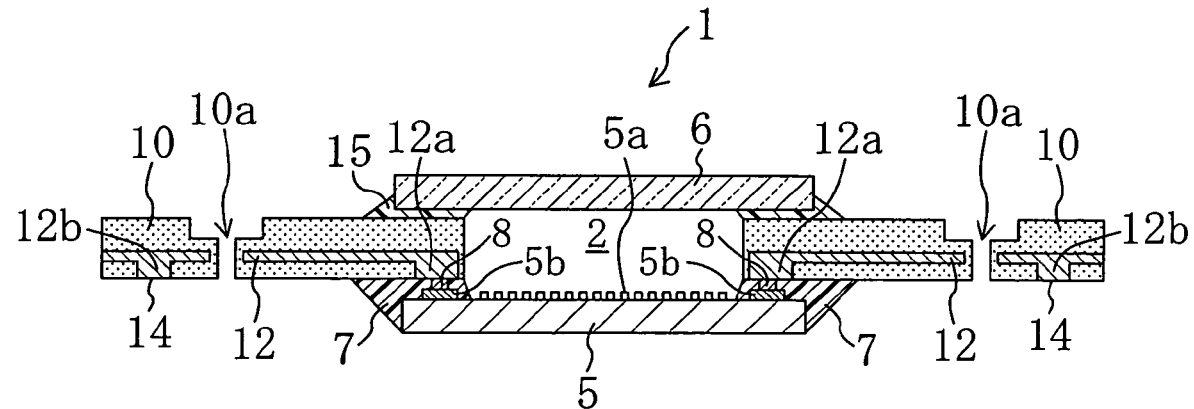
FIGS. 1A and 1B are views illustrating the structure of an optical device 1 according to a first embodiment of the present invention.
Figure 1B:
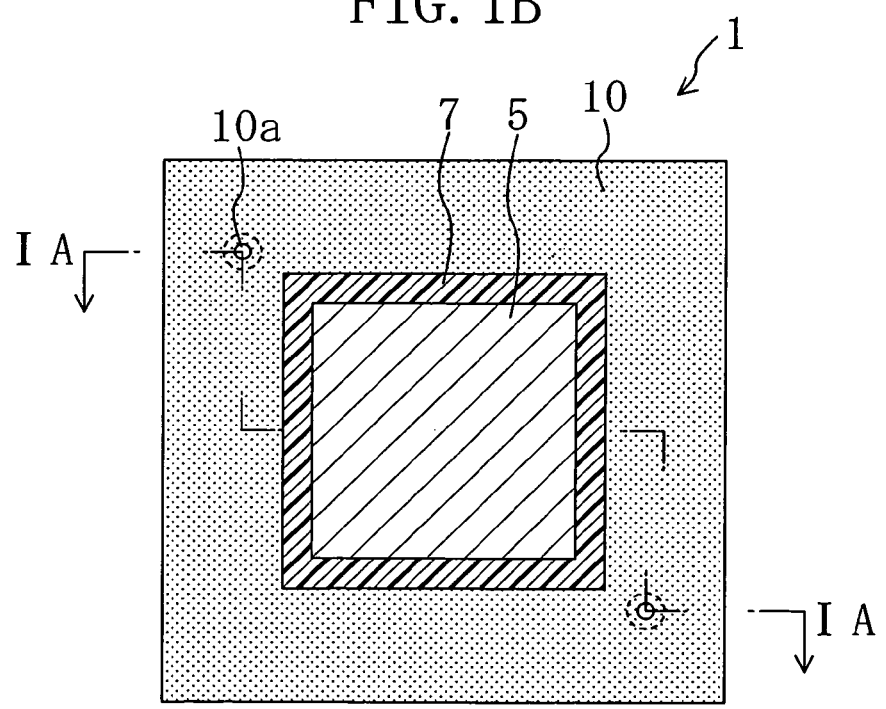
Figure 2:
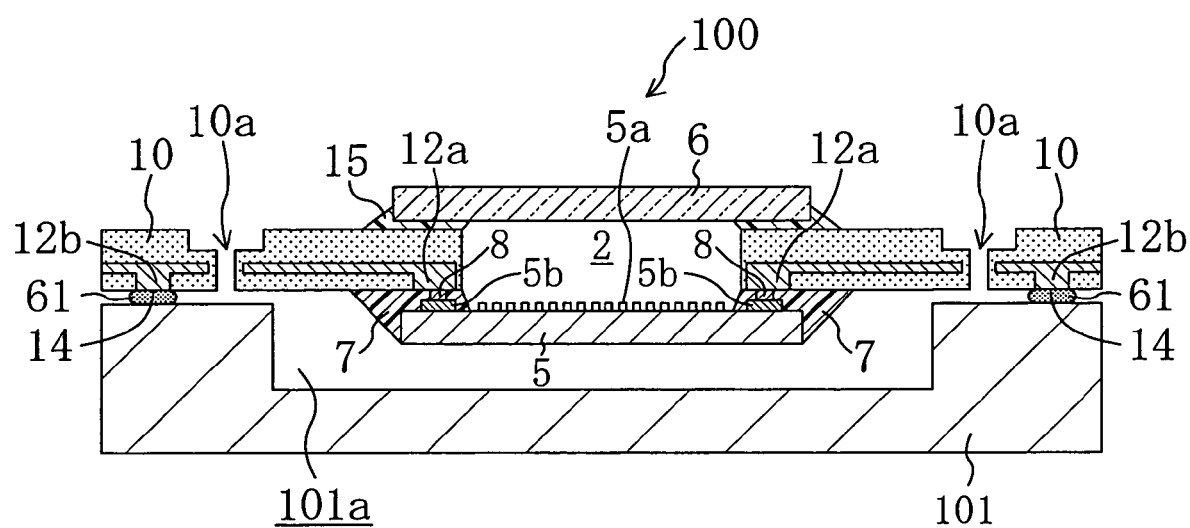
FIG. 2 is a cross-sectional view illustrating the structure of an optical apparatus 100 according to the first embodiment.

In a first embodiment of the present invention, the structure of an optical device 1, the structure of an optical apparatus 100, a method for fabricating the optical device 1 and a method for fabricating the optical apparatus 100 will be described with reference to FIGS. 1A and 1B, FIG. 2, FIGS. 3A through 3F and FIGS. 4A and 4B. Note that FIGS. 1A through 1B are views illustrating the structure of the optical device 1. FIG. 2 is a cross-sectional view illustrating the structure of the optical apparatus 100. FIGS. 3A through 3F are cross-sectional views illustrating respective steps for fabricating the optical device 1. FIGS. 4A and 4B are cross-sectional views illustrating part of steps for fabricating the optical device 1. Moreover, FIG. 1B is a view illustrating a back surface of the optical device 1. FIG. 1A is a cross-sectional view taken along the line IA-IA in FIG. 1B.

-Structure of Optical Device 1 and Structure of Optical Apparatus 100 -

First, the structure of the optical device 1 will be described.

As shown in FIGS. 1A and 1B, the optical device 1 of this embodiment includes the device substrate 10 in which an opening 2 is formed so as to extend substantially in the vertical direction to surfaces of the device substrate 10 and pass through the device substrate 10, a translucent member 6 provided so as to cover a first opening mouth of the opening 2, and an optical element chip 5 which is provided so as to cover a second opening mouth of the opening 2 and in which an optical element for emitting/receiving light is formed. The optical element chip 5 includes a surface (which will be hereinafter referred to as an "optical element formation surface") 5a in which the optical element is formed. The optical element formation surface 5a is disposed so as to face the translucent member 6. Furthermore, the optical device 1 includes a conductive portion 12 electrically connected to the optical element. Moreover, a void between the optical element chip 5 and a peripheral portion of the opening 2 is encapsulated by a first sealing resin (encapsulant) 7 and a void between the translucent member 6 and the peripheral portion of the opening 2 is encapsulated by a second sealing resin 15.

The device substrate 10 is formed of a plastic resin such as an epoxy resin or ceramic. Moreover, in the device substrate 10, two position defining holes 10a used as references for defining a center position of the optical device 1 in the X and Y directions are formed. The two position defining holes 10a are used as reference positions in mounting the optical element chip 5 in fabrication process steps for the optical device 1, which will be described later, or references for defining a location in which a cylindrical mirror storing an optical system such as a lens is installed when the cylindrical mirror is installed in an optical apparatus. In this case, if two or more holes 10a for position defining are provided, the center position of the optical device 1 can be found. Therefore, it is preferable that two or more position defining holes 10a are provided.

The translucent member 6 is a member having a transmittance of 70% or more, preferably, 80% or more and, more preferably, 90% or more. For example, glass, transparent plastic and the like are preferable.

In the optical element chip 5, as an optical element, formed is one of the following optical elements: a solid state imaging element such as a CCD, a set of a plurality of light receiving elements discretely arranged, and a light emitting element. The optical element formation surface 5a faces the translucent member 6. Thus, when the optical element is an element for emitting light, light emitted from the optical element passes through the opening 2 in the device substrate 10, transmits through the translucent member 6 and is output to the outside of the optical device 1. When the optical element is an element for receiving light, light received by the optical device transmits through the translucent member 6 to input into the optical device 1, passes through the opening 2 in the device substrate 10 and is received by the optical element.

Moreover, electrode pads 5b are provided so as to be electrically connected to an outer peripheral portion of the optical element formation surface 5a and bumps (protruding electrodes) 8 are provided so that each of the bumps 8 is electrically connected to a surface of an associated one of the electrode pads 5b.

The conductive portion 12 includes a buried portion buried in the device substrate 10 and a terminal portion extending from the buried portion and exposed at a surface of the device substrate 10. The buried portion includes a conductive trunk portion provided so as to extend substantially in the parallel direction to the surfaces of the device substrate 10 and a conductive branch portion provided so as to extend from the conductive trunk portion toward the optical element chip 5. The conductive branch portion includes an inner side conductive branch portion 12a and an outer side conductive branch portion 12b. The inner side conductive branch portion 12a and the outer side conductive branch portion 12b are provided in this order so that the outer side conductive branch portion 12b is more distant from the opening 2 than the inner side conductive branch portion 12b. As described above, one end of each of the inner side conductive branch portion 12a and one end of the outer side conductive branch portion 12b is formed as a unit with the conductive trunk portion. The other end of the inner side conductive branch portion 12a is electrically connected with an associated one of the bumps 8.

Then, the other end of the outer side conductive branch portion 12b is exposed at the surface of the device substrate 10. Specifically, the other end of the outer side conductive branch portion 12b is a terminal portion of the conductive portion 12 and also forms a mount portion 14 to be directly mounted on a wiring board 101. The wiring board 101 will be described later. As described above, the optical device 1 includes the mount portion 14 and thus, when the optical device 1 is mounted on the wiring board 101 to be described later, the thickness of the optical apparatus 100 can be reduced to be relatively thin.

Moreover, as described above, the void between the optical element chip 5 and the peripheral portion of the opening 2 is sealed by the first sealing resin 7, so that an electrical connection portion of the optical element and the conductive portion 12 is encapsulated. Moreover, a void between the translucent member 6 and the peripheral portion of the opening 2 is encapsulated by the second sealing resin 15. Accordingly, there is very low possibility that unnecessary light enters into the optical device 1. Moreover, the optical element chip 5 is fixed onto the device substrate 10 by the first sealing resin 7 and the translucent member 6 is fixed onto the device substrate 10 by the second sealing resin 15.

Next, the structure of the optical apparatus 100 will be described.

As shown in FIG. 2, the optical apparatus 100 in this embodiment includes the optical device 1 and a wiring board 101 in which a concave portion formed in a surface thereof to form an accommodating portion 101a. In the accommodating portion 101a, an optical element chip 5 and the like are accommodated. Moreover, the mount portion 14 of the optical device 1 is directly mounted on a surface of the wiring board 101. Specifically, the mount portion 14 and the wiring substrate 101 are electrically connected to each other with a conductive connection member 61 interposed therebetween. It is preferable that the amount of the conductive connection member 61 is a minimum amount required for electrically connecting the mount portion 14 and the wiring board 101.

In recent years, reduction in thickness for a video camera, a digital camera, a digital still camera and the like has been required. Accordingly, reduction in thickness for a semiconductor device and an optical apparatus to be installed in a video camera, a digital camera, a digital still camera and the like is desired.

In general, an optical apparatus (which will be hereinafter referred to as a "known optical apparatus") in which an optical device (which will be hereinafter referred to as a "known optical device") having a mount portion to which solder balls are electrically connected is mounted on an approximate flat-shaped wiring board is installed in a video camera, a digital camera, a digital still camera or the like. However, such a known optical apparatus has an increased height according to the diameter of the solder balls. A reason for providing the solder balls is to provide the optical element chip so as to be separated from a surface of the wiring board, and the diameter of the solder balls can not be reduced. Therefore, in the known optical apparatus, the maximum thickness of the optical apparatus is larger than the sum of the maximum thickness of the known optical device and the maximum thickness of the wiring board. For this reason, it is difficult to reduce the thickness of the known optical apparatus.

On the other hand, the optical device 1 of this embodiment includes the mount portion 14 to be directly mounted on the wiring board 101. That is, no solder ball is provided onto the other end of the outer side conductive branch portion 12b of the optical device 1. Thus, with use of the optical device 1, compared to the known optical apparatus, the optical apparatus can be fabricated so that the height thereof is not increased according to the diameter of solder balls. Therefore, in the optical device 1, the thickness of the optical device can be reduced.

Moreover, the wiring board 101 on which the optical device 1 is to be mounted includes an accommodating portion 101a and the optical element chip 5 and the like are accommodated in the accommodating portion 101a. Thus, the maximum thickness of the optical apparatus 100 is smaller than the sum of the maximum thickness of the optical device 1 and the maximum thickness of the wiring board 101. Accordingly, the thickness of the optical apparatus 100 can be reduced, compared to the known optical apparatus. Specifically, the optical apparatus 100 can be fabricated so as to have a thickness in the range from 0.2 mm to 0.8 mm. As has been described, with the optical device 1 and the optical apparatus 100 installed in a video camera and the like, the thickness of the video camera can be reduced.

Furthermore, as described above, with the optical device 1 of this embodiment, invasion of unnecessary light can be prevented. If the optical element is an element for receiving light, analysis such as image processing can be correctly performed using light received by the optical element. Moreover, a situation where unnecessary light that has been entered into the optical device 1 is reflected off a surface of the optical element and emitted to the outside of the optical device 1 can be avoided, and therefore, if the optical element is an element for emitting light, only desired light can be emitted to the outside of the optical device 1. Accordingly, the optical device 1 can emit light exhibiting excellent image processing accuracy and desired characteristics, compared to the semiconductor device in which the semiconductor element described in the Japanese Laid-Open Publication No. 10-135397.

Moreover, in the optical apparatus 100 in this embodiment, part of the wiring board located around the accommodating portion 101a functions as a light blocking member. Thus, the optical apparatus 100 in this embodiment can emit light exhibiting excellent image processing accuracy and desired characteristics, compared to the semiconductor device described in Japanese Laid-Open Publication No. 10-135397.

Note that the wiring board on which the optical device 1 is mounted includes the accommodating portion 101a, so that the optical element chip 5 can be provided so as to be separated from a surface of the wiring board 101 as in the known optical apparatus.

-Process Steps for Forming Optical Device 1 -

Figure 3A:
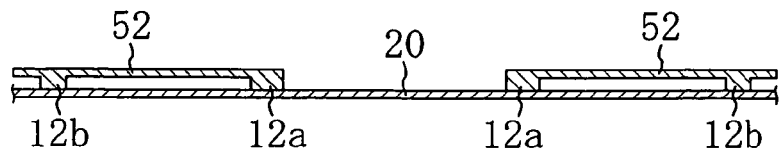
FIGS. 3A through 3F are cross-sectional views illustrating respective steps for fabricating the optical device 1 according to the first embodiment.

First, as shown in FIG. 3A, a lead frame 52 in which an interconnect pattern is formed is placed on a sealing tape 20. In this case, half-etching or stamping is performed so that a concave portion is formed so as to be located under most part of the lead frame 52 and only parts of the lead frame 52 to be an internal terminal portion 12a and an external terminal portion 12b are left as protruding portions extending downward from a bottom surface of the concave portion. Thus, a lead frame member in which the lead frame 52 is placed on the sealing tape 20 is formed. The lead frame 52 is to be the conductive portion 12.

Figure 3B:
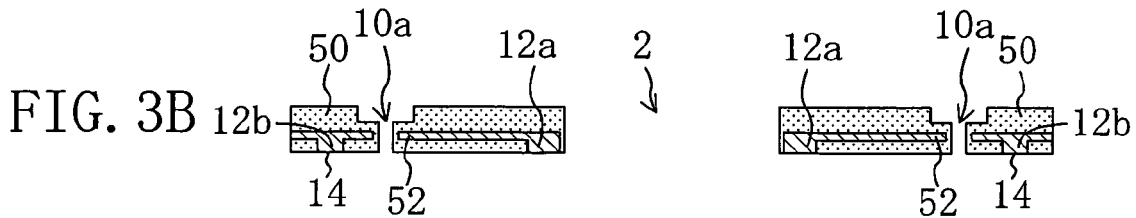

Next, as shown in FIG. 3B, molding is performed. The details of the molding are shown in FIGS. 4A and 4B. In this process step, first, the lead frame member described above is placed in a molding die 30. In this case, the molding die 30 is shown as a single piece member in FIG. 4A, but the molding die 30 actually includes a lower molding die formed of an approximate flat plate and an upper molding die covering the lower molding die. The upper molding die includes a die cavity 30a, a divider portion 30b and pin members 30c, which are provided in one surface of the upper molding die. Each of the pin members 30c is provided in the die cavity 30a. The divider portion 30b is part to be an opening 2 and the pin members 30c are parts to be position defining holes 10a. With the lead frame 52 facing upward, the lead frame member is placed on a surface of the lower molding die. Then, the upper molding die is turned so that a surface thereof in which the die cavity 30a is formed faces downward and then placed over the lead frame member so as to cover the lead frame member. Next, as shown in FIG. 4B, a plastic resin such as an epoxy resin is filled in the die cavity 30a on the molding die 30. Thereafter, when the plastic resin is anchored, the molding die is removed and the sealing tape 20 is peeled off from the lead frame member. Thus, a molded body 50 in which the lead frame 52 is buried is obtained. In this case, part of each of the inner side conductive branch portions 12a and the external terminal portions 12b is exposed. The exposed part of each of the inner side conductive options 12b is the mount portion 14. Note that in the process step of FIG. 3D, bumps 8 and the like are provided so that each of the bumps 8 is located on the exposed part of each of the inner side conductive branch portions 12b.

Figure 3C:
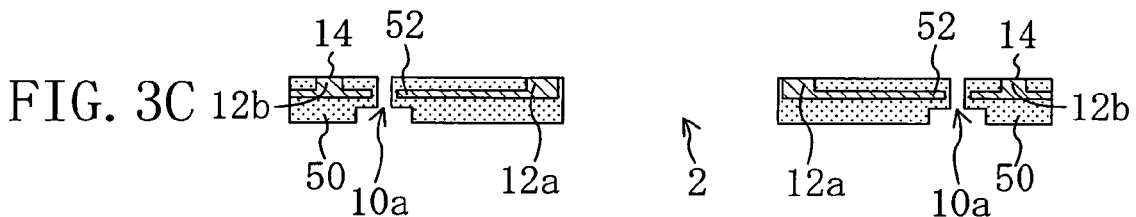

Subsequently, in the process step of FIG. 3C, the molded body 50 is turned upside down and placed.

Then, although not shown in the drawings, a boundary portion between optical device formation regions located adjacent to the molded body 50 is cut at the center of a cutting portion, thereby dividing the molded body 50 into individual optical devices. Thus, device substrates 10 including the interconnect portions 12 buried therein, respectively, are obtained.

Figure 3D:
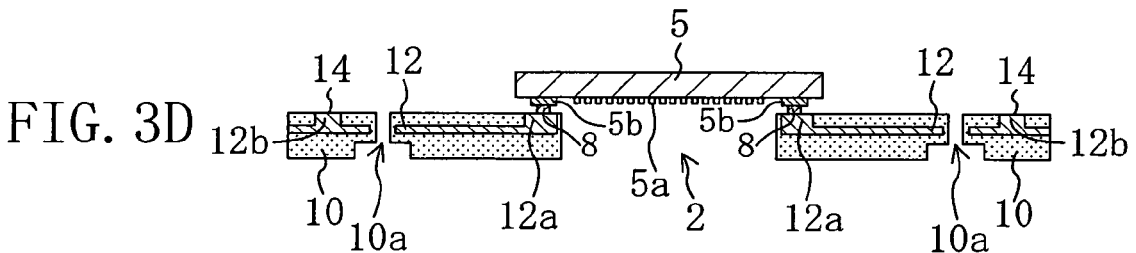

Thereafter, in the process step of FIG. 3D, with the optical element formation surface 5a of the optical element chip 5 facing downward, the optical element chip 5 is mounted so as to cover an opening mouth (second opening mouth) in the surface in which the mount portion 14 is provided. In this case, bumps 8 are formed on the exposed surface of the inner side conductive branch portions 12a (the other end of each of the inner side of the conductive branch portions 12a), respectively, and then electrode pads 5b of the optical element chip 5 are provided on the bumps 8, respectively, so that each of the bumps 8 is flip-chip connected to an associated one of the electrode pads 5b. Note that in placing the optical element chip 5, if the position of the optical element chip 5 is defined using the position defining holes 10a provided in the device substrate 10 as references, the optical element chip 5 can be placed in a desired orientation with respect to the device substrate 10.

Figure 3E:
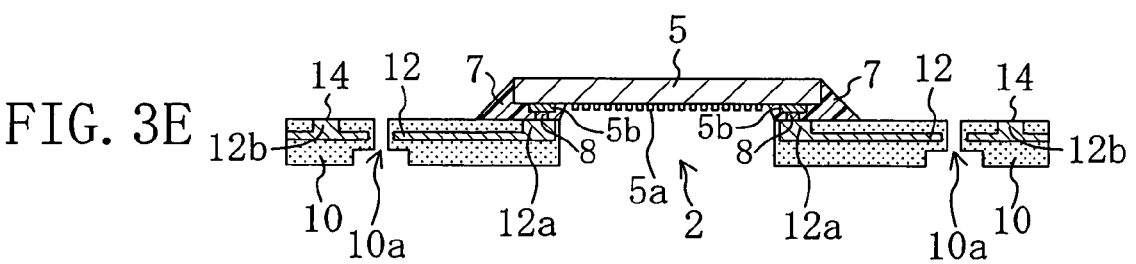

Then, in the process step of FIG. 3E, the inner side conductive branch portions 12a, the bumps 8 and the electrode pads 5b are encapsulated using a first sealing resin 7. Thus, an electrical connection portion between the optical device and each of the interconnect portions 12. That is, a void between the optical element chip 5 and a peripheral portion of the opening 2 is encapsulated by the first sealing resin 7.

Figure 3F:
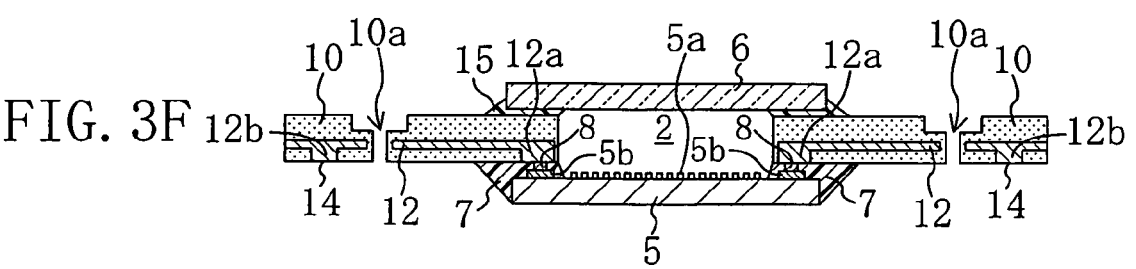

Then, in the process step of FIG. 3F, with the molded body obtained in the process step of FIG. 3E turned upside down and then placed, the translucent member 6 is mounted so as to cover an opening mouth (first opening mouth) of the opening 2 which is not covered. A void between the translucent member 6 and the peripheral portion of the opening 2 is encapsulated using a second sealing resin 15. Thus, the optical device 1 is fabricated.

Thereafter, although not shown in the drawings, the optical device 1 is mounted on the wiring board 101 including the accommodating portion 101a, i.e., the concave portion. In this case, the light emitting element chip 5 of the optical device 1 and the like are accommodated in the accommodating portion 101a and the mount portion 14 and the wiring board 101 are electrically connected with each other using a conductive connection member 61 such as solder. Thus, the optical apparatus 100 is fabricated.

In this embodiment, the optical device 1 does not include a solder ball. Thus, compared to the known optical device, fabrication costs for the optical device 1 can be suppressed to a low level and a fabrication time for the optical device 1 can be reduced. In the same manner, compared to the known optical apparatus, fabrication costs for the optical apparatus 100 can be suppressed to a low level and a fabrication time for the optical apparatus 100 can be reduced.

Second Embodiment

Figure 5:
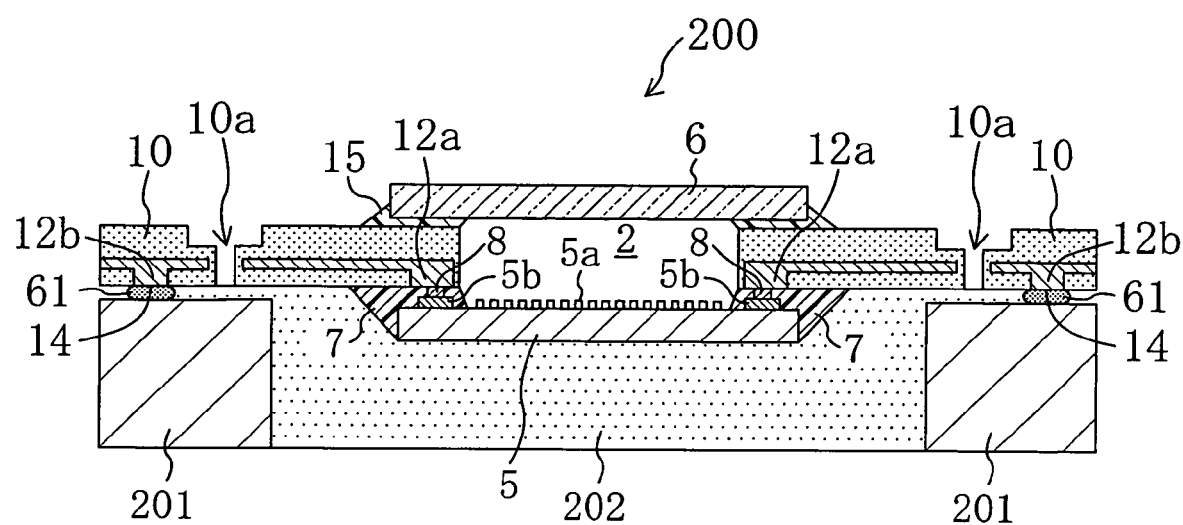
FIG. 5 is a cross-sectional view of an optical element 200 according to a second embodiment of the present invention.
Figure 6A:
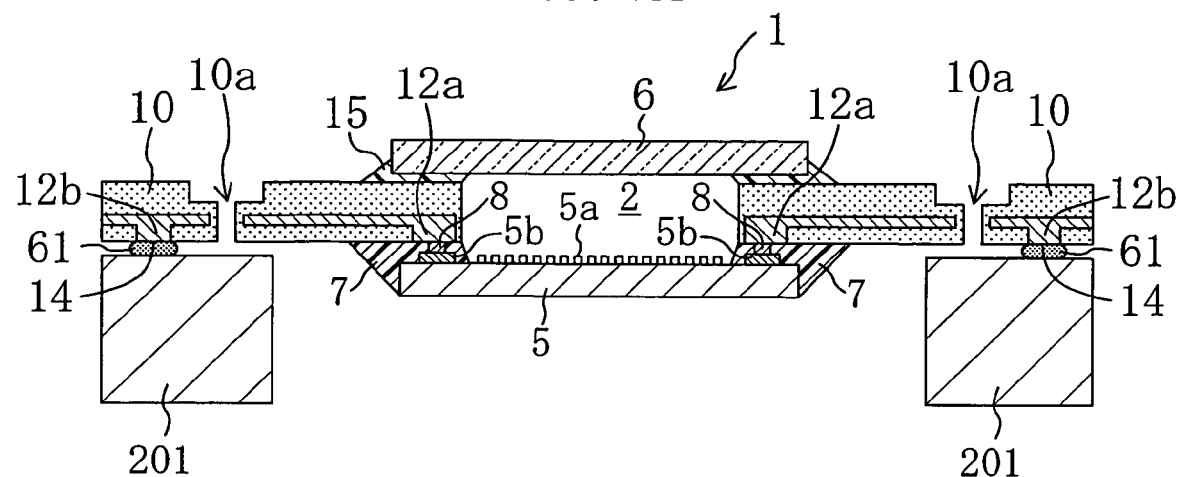
FIGS. 6A and 6B are cross-sectional views illustrating respective part of steps for fabricating the optical element 200 according to the second embodiment.
Figure 6B:
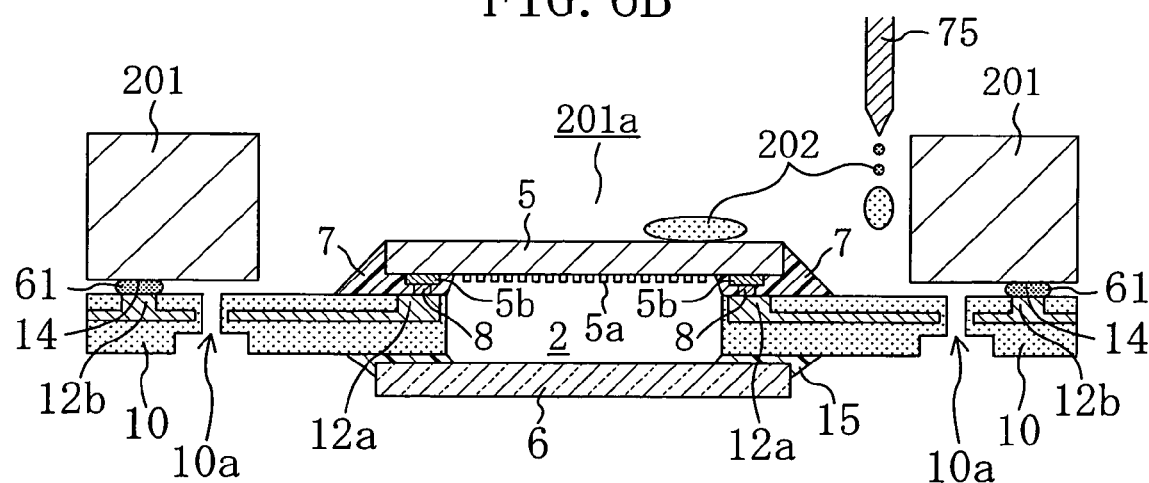

In a second embodiment of the present invention, the structure of an optical apparatus 200 and a method for fabricating an optical apparatus 200 will be described with reference to FIG. 5 and FIGS. 6A and 6B. FIG. 5 is a cross-sectional view illustrating the structure of the optical apparatus 200. FIGS. 6A and 6B are cross-sectional views illustrating respective steps for fabricating the optical apparatus 200. The cross sections shown in FIGS. 5B, 6A and 6B are taken along the line IA-IA in FIG. 1A.

The optical device of this embodiment is approximately the same as the optical device 1 of the first embodiment. Therefore, the description of the structure of the optical device and the method for fabricating the optical device will be omitted.

-The Structure of Optical Apparatus 200-

As shown in FIG. 5, the optical apparatus 200 of this embodiment includes an optical device of the first embodiment and a wiring board 201 in which an accommodating portion 201a (shown in FIG. 6A), i.e., a through hole is formed. In the accommodating portion 201a, an optical element chip 5 and the like are accommodated, and the accommodating portion 201a is encapsulated by an encapsulant (through hole encapsulant) 202. Thus, the accommodating portion 201a is encapsulated using the encapsulant 202, so that the optical element chip 5 is fixed in the accommodating portion 201a and unnecessary light can not enter the optical apparatus 200 through the accommodating portion 201a. That is, in this embodiment, the encapsulant 202 serves as a light blocking member. Moreover, in the optical apparatus 200, as in the optical apparatus 100 of the first embodiment, a mount portion 14 and a wiring board 201 are electrically connected to each other with a conductive connection member 61 interposed therebetween.

-Process Steps for Fabricating Optical Apparatus 200-

First, in the process step of FIG. 6A, the optical device 1 fabricated according to the process steps described in the first embodiment is mounted on the wiring board 201 in which the accommodating portion 201a, i.e., a through hole is formed. In this step, mounting is performed so that the optical element chip 5 and the like are accommodated in the accommodating portion 201a. Moreover, the mount portion 14 of the optical device 1 and the wiring board 201 are electrically connected using the conductive connection member 61. Note that a necessary amount of the conductive connection member 6 for mounting the optical device 1 onto the wiring board 201 is applied to the mount portion 14.

Then, in the process step of FIG. 6B, the encapsulant portion 201a, i.e., a through hole is encapsulated. In this step, with the accommodating portion 201a facing upward, the accommodating portion 201a is encapsulated using the encapsulant 202 supplied from the nozzle 75. Thus, the optical apparatus 200 of this embodiment can be fabricated.

The optical apparatus 200 of this embodiment and the optical apparatus 100 of the first embodiment are different from each other only in the shape of an accommodating portion in a wiring board. In the first embodiment, the accommodating portion 101a has to be formed in the wiring board 101 so as to have a larger thickness than the thickness of the optical element chip 5. On the other hand, in the wiring board 201, a through hole is formed in a surface thereof, thereby forming the accommodating portion 201a. Thus, the wiring board 201 may have a larger thickness than the thickness of the optical element chip 5 and the optical element chip 5 may have a larger thickness than the thickness of the wiring board 201. As has been described, the optical apparatus 200 can be designed in a more simple manner, compared to the optical apparatus 100.

Third Embodiment

Figure 7:
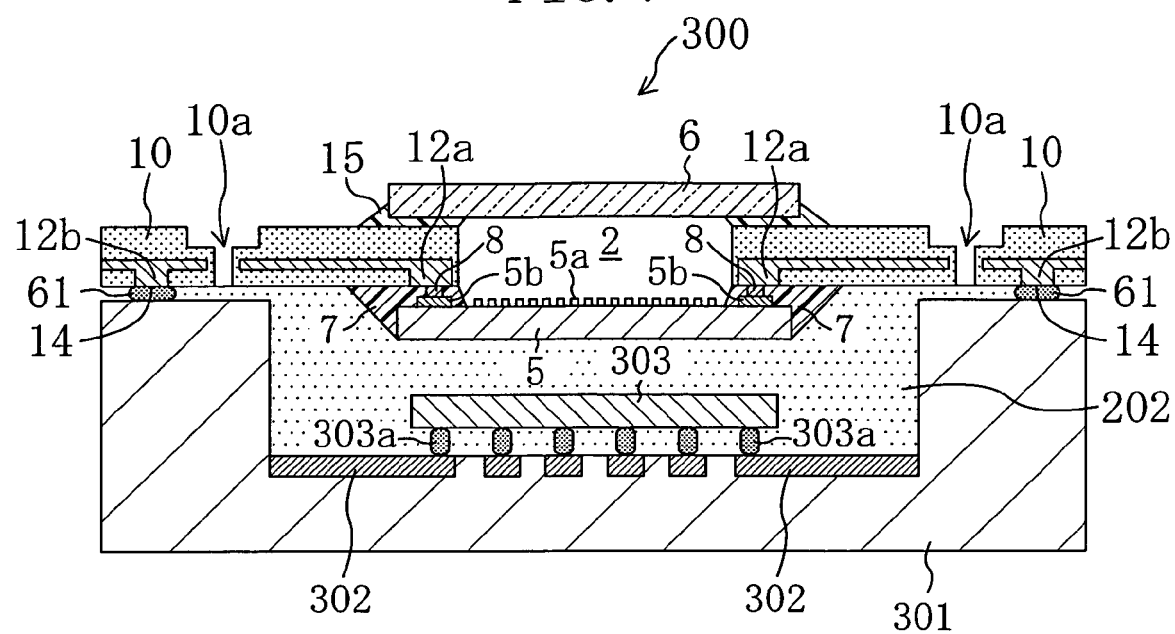
FIG. 7 is a view illustrating the structure of an optical apparatus 300 according to a third embodiment of the present invention.
Figure 8:
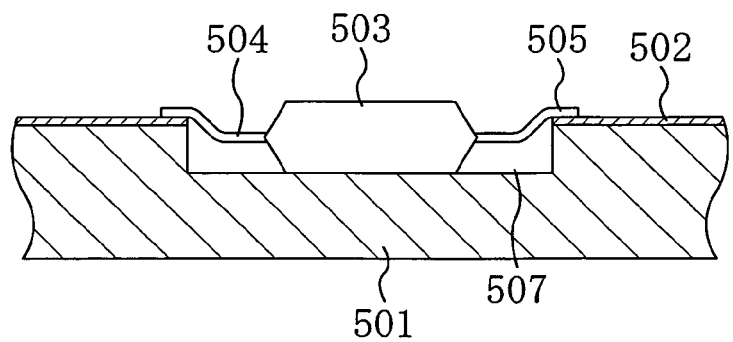
FIG. 8 is a cross-sectional view illustrating the structure of a semiconductor device in a known example.

In a third embodiment of the present invention, the structure of an optical apparatus 300 and a method for fabricating the optical apparatus 300 will be described with reference to FIG. 7. FIG. 7 is a cross-sectional view illustrating the structure of the optical apparatus 300. The cross section shown in FIG. 7 is taken along the line IA-IA of FIG. 1B.

In the optical device of this embodiment is approximately the same as the optical device 1 of the first embodiment. Therefore, in this embodiment, the description of the structure of the optical device and the method for fabricating the optical device will be omitted.

-Structure of Optical Apparatus 300-

As shown in FIG. 7, the optical apparatus 300 of this embodiment includes the optical device of the first embodiment and a wiring board 301 in which an accommodating portion (not shown), i.e., a concave portion is formed. In the accommodating portion, an optical element chip 5 and a semiconductor element chip 303 such as a DSP are accommodated, and the accommodating portion is encapsulated by an encapsulant (accommodating portion encapsulant) 202. In this case, a plurality of interconnects 302 are provided on a surface of the accommodating portion so that each of the interconnects 302 is separately located in a different part. On a surface of the semiconductor element chip 303, interconnects 303a are provided so that each of the interconnects 303a is separately located in a different part. Moreover, each of the interconnects 302 in the accommodating portion is electrically connected to an associated one of the interconnects 303a of the semiconductor element chip 303 by wiring bonding, flip-chip bonding or the like. Also, the optical element chip 5 is accommodated in the accommodating portion and the accommodating portion is encapsulated by the encapsulant 202. Thus, there is very low possibility that unnecessary light enters into the optical apparatus 300. That is, in this embodiment, part of the wiring board located around the accommodating portion and the encapsulant 202 serve as light blocking members. Moreover, in the optical apparatus 300, as in the optical apparatus 100 in the first embodiment, the mount portion 14 and the wiring board 301 are electrically connected to each other with a conductive connection member 61 interposed therebetween.

-Process Steps for Fabricating Optical Apparatus 300-

Although not shown in the drawings, first, a semiconductor element chip 303 is mounted on a wiring board 301 in which an accommodating portion, i.e., a through hole is formed. In this step, mounting is performed so that with each of the interconnects 303a of the semiconductor element chip 303 connected to an associated one of the interconnects 302 of the accommodating portions, the semiconductor element chip 303 is accommodated in the accommodating portion.

Next, the accommodating portion is encapsulated by the encapsulant 202. Thus, the semiconductor chip 303 is fixed.

Subsequently, the optical device fabricated according to the method described in the first embodiment is mounted on the wiring board 301. A minimum amount of the conductive connection member 61 required is applied to the mount portion 14 and the optical element chip 5 is placed on a surface of the encapsulant 202 for encapsulating the accommodating portion, so that the optical device is mounted on the wiring board 301. Thus, the optical element chip 5 is accommodated and the optical apparatus 300 can be fabricated.

The optical apparatus 300 of this embodiment includes a DSP as the semiconductor element chip 303. Thus, the optical apparatus 300 can perform image processing and the like at high speed, compared to the optical apparatuses 100 and 200 of the first embodiment and second embodiments.

Other Embodiments

The present invention may be configured in the following manner in connection with each of the first, second and third embodiments.

Instead of the position defining holes 10a provided in the device substrate 10, a position defining level-difference portion may be provided in a peripheral portion of the device substrate 10. The position defining level-difference portion has approximately the same function as that of the position defining holes 10a.

Moreover, in the step of fabricating the optical device 1, the device substrate 10 may be divided into individual optical devices after the optical element chip 5 of FIG. 3E has been placed on the device substrate 10 or after the translucent member 6 of FIG. 3F is placed on the device substrate 10.

Moreover, it is preferable that a sealing resin is provided also in a void between the device substrate 10 and the wiring board 101. With the sealing resin provided in the void, invasion of unnecessary light into the optical apparatus 100 can be completely prevented.

Moreover, although the molding step in process steps for fabricating the optical device 1 is performed with the lead frame 52 placed on the sealing tape 20, the sealing tape 20 does not have to be used. However, when the sealing tape 20 is used, upper and lower surfaces of the lead frame 52 can be clamped with the upper molding die and the lower molding die and thus the upper and lower surfaces of the lead frame 52 can be stably kept adhered with a surface of the molding die. That is, with each of the upper and lower surfaces of the lead frame 52 adhered with a surface of the molding die, a plastic resin can be filled. As a result, squeezing-out of resin due to molding can be effectively suppressed and the structure in which the mount portion 14 is exposed at a surface of the device substrate 10 can be obtained. Therefore, for example, solder connection when mounting the optical device 1 onto the wiring board 101 can be simplified, and simplification and facilitation of mounting the optical device 1 can be achieved.

The present invention may be configured in the following manner in connection with the third embodiment.

The semiconductor element chip 303 may be packaged and then provided in the accommodating portion. Also, without performing packaging, the semiconductor element chip 303 in a bare state may be provided in the accommodating portion. Moreover, the semiconductor element chip 303 may be a power supply IC or a peripheral member.

As has been described, for example, the present invention is useful for an optical device including an optical element chip in which an optical element for emitting or receiving light is formed, an optical apparatus including the optical device and the like.

What is claimed is:

1. An optical apparatus comprising:
   an optical device including a device substrate having an opening, a conductive portion including a buried portion buried in the device substrate and a terminal portion extending from the buried portion and exposed at the device substrate, a translucent member provided so as to cover the opening from the upper side, and an optical element chip provided so as to cover the opening from the lower side, the optical element chip being electrically connected to the conductive portion; and
   a wiring board having an accommodating portion, wherein the optical element chip is accommodated in the accommodating portion.

2. The optical apparatus of claim 1, wherein the terminal portion of the conductive portion is substantially flush with a surface of the device substrate and is a mount portion to be directly mounted on the wiring board.

3. The optical apparatus of claim 1, wherein an electrical connection portion between the optical element chip and the conductive portion is encapsulated by an encapsulant.

4. The optical apparatus of claim 1, wherein the accommodating portion is a concave portion formed in a surface of the wiring board.

5. The optical apparatus of claim 4, wherein a semiconductor element chip is further accommodated in the accommodating portion.

6. The optical apparatus of claim 1, wherein the accommodating portion is a through hole of the wiring board.

7. The optical apparatus of claim 6, wherein the accommodating portion is encapsulated by an encapsulant.

8. The optical apparatus of claim 1, wherein the opening of the optical device is a through hole.

9. The optical apparatus of claim 1, wherein an optical element for emitting or receiving light formed in a surface of the optical element chip faces the translucent member.

10. The optical apparatus of claim 1, wherein the terminal portion of the conductive portion mounts on the wiring board with a conductive adhesive.

11. The optical apparatus of claim 4, wherein the accommodating portion is encapsulated by an encapsulant.

12. An optical apparatus comprising:
   an optical device including a device substrate having an opening, a conductive portion including a buried portion buried in the device substrate and a terminal portion extending from the buried portion and exposed at the device substrate, a translucent member provided so as to cover the opening from the upper side, and an optical element chip provided so as to cover the opening from the lower side, the optical element chip being electrically connected to the conductive portion; and
   a wiring board having an accommodating portion with at least the optical element chip accommodated therein,
   wherein a maximum thickness of the optical apparatus is smaller than a sum of a maximum thickness of the optical device and a maximum thickness of the wiring board.

13. An optical apparatus comprising:
   an optical device including a device substrate having an opening, a conductive portion including a buried portion buried in the device substrate and a terminal portion extending from the buried portion and exposed at the device substrate, a translucent member provided so as to cover the opening from the upper side, and an optical element chip provided so as to cover the opening from the lower side, the optical element chip being electrically connected to the conductive portion; and
   a wiring board having an accommodating portion with at least the optical element chip accommodated therein,
   wherein a light blocking member for blocking light into the optical element chip is provided in the accommodating portion.

14. The optical apparatus of claim 13, wherein the light blocking member is part of the wiring board.

15. The optical apparatus of claim 13, wherein the light blocking member is an encapsulant for encapsulating the accommodating portion.

* * * * *

UNITED STATES PATENT AND TRADEMARK OFFICE
CERTIFICATE OF CORRECTION

| | |
|---|---|
| PATENT NO. | : 7,302,125 B2 |
| APPLICATION NO. | : 11/260175 |
| DATED | : November 27, 2007 |
| INVENTOR(S) | : Taku Gobara et al. |

It is certified that error appears in the above-identified patent and that said Letters Patent is hereby corrected as shown below:

On the title page

Under item (56) References Cited, FOREIGN PATENT DOCUMENTS, add:

-- JP 10-135397  5/1998 --

Signed and Sealed this

Twenty-seventh Day of May, 2008

JON W. DUDAS
*Director of the United States Patent and Trademark Office*